(12) United States Patent
Li

(10) Patent No.: US 10,219,392 B2
(45) Date of Patent: Feb. 26, 2019

(54) SEALANT AND PREPARATION METHOD THEREOF, AND DISPLAY PANEL MOTHERBOARD AND MANUFACTURING METHOD THEREOF

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Hongpeng Li, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 49 days.

(21) Appl. No.: 15/310,149

(22) PCT Filed: Feb. 19, 2016

(86) PCT No.: PCT/CN2016/074117
§ 371 (c)(1),
(2) Date: Nov. 10, 2016

(87) PCT Pub. No.: WO2017/054397
PCT Pub. Date: Apr. 6, 2017

(65) Prior Publication Data
US 2017/0265310 A1 Sep. 14, 2017

(30) Foreign Application Priority Data
Sep. 28, 2015 (CN) .......................... 2015 1 0629709

(51) Int. Cl.
*H05K 1/11* (2006.01)
*H05K 1/14* (2006.01)
*H05K 3/38* (2006.01)
*C09K 3/10* (2006.01)
(Continued)

(52) U.S. Cl.
CPC ................ *H05K 3/386* (2013.01); *C09J 4/00* (2013.01); *C09J 4/06* (2013.01); *C09J 11/08* (2013.01);
(Continued)

(58) Field of Classification Search
CPC ........... C09J 11/08; C09J 4/06; H05K 1/0373; H05K 1/144; H05K 1/145; H05K 3/22; H05K 3/386
See application file for complete search history.

(56) References Cited

U.S. PATENT DOCUMENTS 6,803,400 B1 * 10/2004 Butterbach .............. D04H 1/64
427/372.2
2003/0175497 A1 * 9/2003 Kobe ..................... C09J 7/0289
428/317.9
(Continued)

FOREIGN PATENT DOCUMENTS

| CN | 1511913 A | 7/2004 |
|---|---|---|
| CN | 101885957 A | 11/2010 |

(Continued)

OTHER PUBLICATIONS

Search Report and Written Opinion dated Jul. 5, 2016 from State Intellectual Property Office of the P.R. China.
(Continued)

*Primary Examiner* — Yuriy Semenenko
(74) *Attorney, Agent, or Firm* — Dilworth & Barrese, LLP.; Michael J. Musella, Esq.

(57) ABSTRACT

A sealant and a preparation method thereof, a display panel motherboard and a manufacturing method thereof are disclosed. The sealant includes a main adhesive material and a water swellable material dispersed and doped in the main adhesive material. The sealant and the preparation method thereof, the display panel motherboard and the manufactur-
(Continued)

ing method thereof are capable of solving a problem of a notch formed in a sealant where a etchant flows into the display panel unit when the display panel mother board is subjected to a thinning treatment.

14 Claims, 2 Drawing Sheets

(51) Int. Cl.
    *G02F 1/1339* (2006.01)
    *C09J 4/06* (2006.01)
    *C09J 11/08* (2006.01)
    *H05K 1/03* (2006.01)
    *H05K 3/22* (2006.01)
    *C09J 4/00* (2006.01)
    *H05K 3/36* (2006.01)

(52) U.S. Cl.
    CPC .............. *C09K 3/10* (2013.01); *G02F 1/1339* (2013.01); *H05K 1/0373* (2013.01); *H05K 1/144* (2013.01); *H05K 1/145* (2013.01); *H05K 3/22* (2013.01); *H05K 3/368* (2013.01); *H05K 2201/042* (2013.01); *H05K 2201/10136* (2013.01)

(56) References Cited

U.S. PATENT DOCUMENTS

2003/0211291 A1* 11/2003 Castiglione ............... B32B 7/02
                                                                                                          428/172
2006/0243363 A1* 11/2006 Hunter .................... C03C 3/089
                                                                                                          149/109.2
2008/0199500 A1* 8/2008 Okumura ................. A61K 8/88
                                                                                                           424/401
2014/0350136 A1* 11/2014 Xiao ....................... C07C 67/26
                                                                                                            522/43
2015/0252208 A1* 9/2015 Xiao ......................... C09J 4/06
                                                                                                            522/44

FOREIGN PATENT DOCUMENTS

| CN | 101957512 A | 1/2011 |
| CN | 103087641 A | 5/2013 |
| CN | 103205216 A | 7/2013 |
| CN | 103305133 A | 9/2013 |
| CN | 103849322 A | 6/2014 |
| CN | 105131887 A | 12/2015 |
| JP | S61166877 A | 7/1986 |
| WO | WO 2014/153835 | * 10/2014 |

OTHER PUBLICATIONS

First Chinese Office Action dated Mar. 28, 2017.
Zhao Wenyuan, Wang Yijun, Chemical Industrial Press, Functional Polymer Materials, p. 297-298, Mar. 31, 2008.
Song, Lihua, Hunan University Press, Illustration of Practical Operation Skills for Waterproof Projects, p. 152, Dec. 31, 2008.
Third Chinese Office Acftion dated Nov. 15, 2017.
Second Chinese Office Action dated Aug. 21, 2017.

* cited by examiner

SEALANT AND PREPARATION METHOD THEREOF, AND DISPLAY PANEL MOTHERBOARD AND MANUFACTURING METHOD THEREOF

The present application claims priority of pending Chinese Patent Application No. 201510629709.2 filed on Sep. 28, 2015, the present disclosure of which is incorporated herein by reference in its entirety as part of the present application.

TECHNICAL FIELD

Embodiments of the present disclosure relate to a sealant and a preparation method thereof, and a display panel motherboard and a manufacturing method thereof.

BACKGROUND

A liquid crystal display has been widely applied in various display fields, such as homes, public places, office occasions and personal electronics related products. A liquid display panel includes an array substrate and a color filter substrate cell-assembled with each other, and a liquid crystal located between the array substrate and the color filter substrate.

In order to achieve mass production, generally a plurality of array substrates are formed on an array substrate motherboard, a plurality of color filter substrates are formed on a color filter substrate motherboard, and a display panel motherboard is firstly formed after the array substrate motherboard and the color filter substrate motherboard are cell-assembled. The plurality of array substrates are formed on the array substrate motherboard, and the plurality of color filter substrates are formed on the color filter substrate motherboard. The display panel motherboard thus formed after the array substrate motherboard and the color filter substrate motherboard are cell-assembled is cut along a cutting line, and a plurality of display panel units is formed.

SUMMARY

An embodiment of the present disclosure sealant provides a sealant including: a main adhesive material and a water swellable material dispersed and doped in the main adhesive material.

In an example, a value of a water swelling rate of the water swellable material ranges from 110% to 200%.

In an example, a value of a mass percentage of the water swellable material in the sealant ranges from 20% to 30%.

In an example, the water swellable material includes at least one of sodium polyacrylate, polyvinyl alcohol, hydrophilic polyurethane or hydrophilic rubber.

In an example, the body adhesive material includes: light-cured resin, a photoinitiator, a curing agent, a coupling agent and a silicone ball.

Another embodiment of the present disclosure sealant provides a display panel motherboard, including: a first motherboard and a second motherboard which are cell-assembled with each other, wherein, the first motherboard includes a plurality of first substrate units, the second motherboard includes a plurality of second substrate units, and the first substrate units correspond to the second substrate units in one-to-one correspondence; a first sealant is provided on the first motherboard and the second motherboard in a first packaging region of, and the first packaging region is a region surrounding the plurality of first substrate units and the plurality of second substrate units; a second sealant is provided on the first substrate unit and the second substrate unit in a second packaging region; wherein, the first sealant is the above described sealant.

In an example, a liquid crystal layer is filled between each pair of corresponding first substrate unit and second substrate unit, and the second packaging region is a plurality of regions respectively surrounding a plurality of the liquid crystal layers.

Yet another embodiment of the present disclosure sealant provides a preparation method of a sealant, including: mixing and stirring a water swellable material and a material forming a body adhesive material in proportion, so that the water swellable material can be dispersed and doped in a body adhesive material.

In an example, mixing and stirring the water swellable material and the material forming the body adhesive material in proportion is performed in a dry environment with relative humidity lower than 10%.

In an example, after mixing and stirring the water swellable material and the material forming the body adhesive material in proportion, the method further includes: performing defoaming treatment on the body adhesive material in which the water swellable material is dispersed and doped.

Yet another embodiment of the present disclosure sealant provides a manufacturing method of a display panel motherboard, including:

forming a first motherboard and a second motherboard, wherein the first motherboard includes a plurality of first substrate units, and the second motherboard includes a plurality of second substrate units;

forming first sealant in a first packaging region of the first motherboard, and forming second sealant in a second packaging region of the first substrate unit, wherein, the first packaging region is a region surrounding a plurality of the first substrate units, and the first sealant is the above described sealant;

arranging the first motherboard unit and the second motherboard opposite to each other, and bonding the first motherboard and the second motherboard by the first sealant and the second sealant, wherein the plurality of first substrate units in the first motherboard correspond to the plurality of second substrate units in the second motherboard in one-to-one correspondence;

performing a thinning treatment on the first motherboard and/or the second motherboard, to obtain the display panel motherboard.

In an example, the manufacturing method of the display panel motherboard further includes: before the performing thinning treatment on the first motherboard and/or the second motherboard, performing curing treatment on the first sealant.

BRIEF DESCRIPTION OF THE DRAWINGS

In order to clearly illustrate the technical solution of the embodiments of the disclosure, the drawings needing to be used in the embodiments or relevant technical description will be briefly described in the following; it is obvious that the described drawings are only related to some embodiments of the disclosure and thus are not limitative of the disclosure.

DETAILED DESCRIPTION

Figure 1:
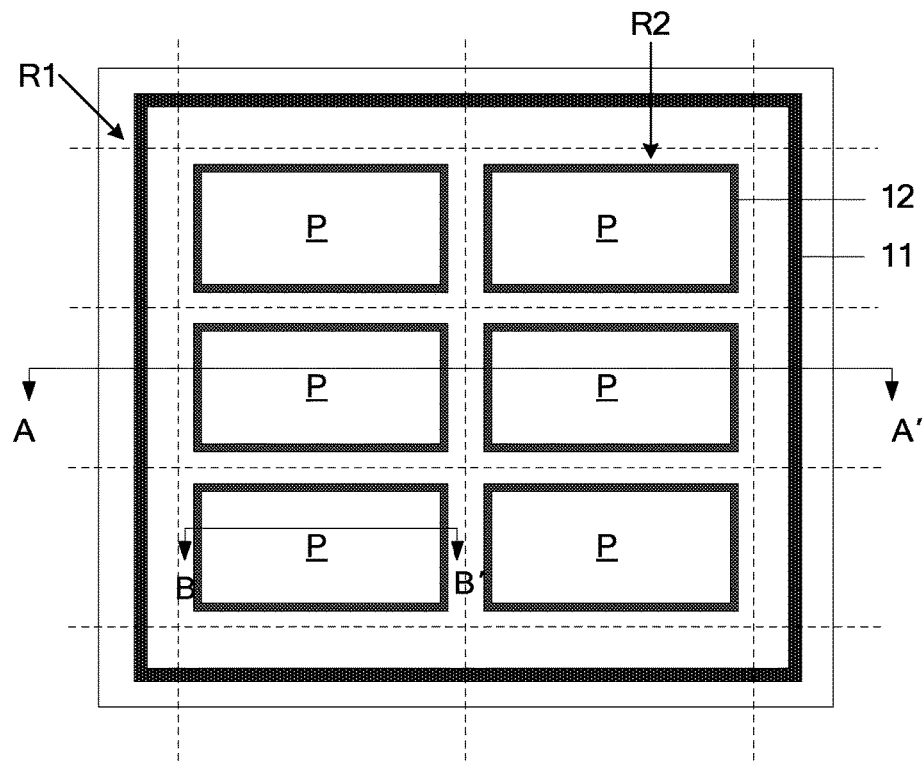
FIG. 1 is a schematic diagram of a display panel motherboard provided by an embodiment of the present disclosure.

The technical solutions of the embodiments of the present disclosure will be described in a clearly and fully understandable way in connection with the drawings. It is obvious that the described embodiments are just a part but not all of the embodiments of the present disclosure. Based on the embodiments of the present disclosure, those skilled in the art can obtain other embodiment(s), without any inventive work, which should be within the scope of the present disclosure.

In a related art, because an array substrate and a color filter substrate respectively include a glass substrate and a layer structure formed on the glass substrate, a thickness of the glass substrate is generally 0.5 mm in order to provide a supporting strength during manufacturing the layer structure. After the array substrate and the color filter substrate are cell-assembled, thinning treatment needs to be performed on the glass substrates, to reduce a thickness of a display panel. In the related art, the thinning treatment is performed after a display panel motherboard is formed, the thickness of the glass substrate is generally reduced by etching the glass substrate with an etching solution, and a general etching solution is acidic etching solution. In order to prevent the display panel from being corroded by the etching solution, when the array substrate motherboard and the color filter substrate motherboard are cell-assembled, first sealant is arranged in a first packaging region of the array substrate motherboard and the color filter substrate motherboard, the first packaging region surrounding all display panel units, so as to perform sealing. Meanwhile, second sealant is arranged in a second packaging region in a periphery of the array substrate and the color filter substrate of each display plane unit, and the second sealant is mainly used for sealing a liquid crystal layer.

In the related art, the second sealant is same as the first sealant and has a good water vapor isolation effect and good adhesiveness. But, because, generally, the second sealant is formed by screen printing, while the first sealant is formed by coating, when bubbles and foreign substances present in the first sealant 11, breakage is likely to happen to form a notch. Therefore, when the thinning treatment is performed on the glass substrate, the acidic etching solution easily enters the display panel and etches the display panel unit, and a yield of a product is reduced.

Embodiments of the present disclosure provide a sealant and a preparation method thereof, and a display panel motherboard and a manufacturing method thereof, in which the sealant swells in water, and therefore a notch position can be automatically healed, which thus reduces a possibility that when thinning treatment is performed on a glass substrate, acidic etching solution enters a display panel and etches the display panel, and improves a yield of a product.

An embodiment of the present disclosure provides a sealant, including: a body adhesive material and a water swellable material dispersed and doped in the body adhesive material.

The water swellable material can be any substance swelling after absorbing water. For example, the water swellable material includes at least one of sodium polyacrylate, polyvinyl alcohol, hydrophilic polyurethane or hydrophilic rubber.

Taking that the water swellable material is the hydrophilic rubber which contains enough amount of hydrophilic groups or substances as an example, when the hydrophilic rubber makes contact with water, the water can enter the hydrophilic rubber by means of surface adsorbing, capillary action, diffusion and the like and forms strong bonding force with the hydrophilic groups or substances in the rubber; along with continuous increase of water molecules, the rubber expands and deforms, and when anti-deformation force and osmotic pressure reach balance, a shape of the hydrophilic rubber is kept relatively stable.

The body adhesive material mainly includes an adhesive material with adhesiveness, and components of the body adhesive material are not limited in the embodiment of the present disclosure.

In the sealant provided by the embodiment of the present disclosure, the water swellable material is dispersed and doped in the body adhesive material. Therefore, in a case that the sealant is disconnected in the middle, automatic connection can be achieved after the sealant encounters water, absorbs the water and swells.

For example, a value of a water swelling rate of the water swellable material ranges from 110% to 200%. Herein, the water swelling rate of the water swellable material refers to a ratio in percentage of a size after the water swellable material absorbs water to a size before the water swellable material absorbs water, in percentage. It should be noted that, a water swelling rate of an existing water swellable material is generally greater than 100%, and the water swellable material in the sealant can be materials with different water swelling rates according to application of the sealant. The embodiment of the present disclosure is illustrated with that the sealant is mainly used for cell-assembling an array substrate motherboard and a color filter substrate motherboard, taking the value of the water swelling rate of the water swellable material ranging from 110% to 200% as an example.

For example, the body adhesive material includes: light-cured resin, a photoinitiator, a curing agent, a coupling agent and a silicone ball. For example, a value of a mass percentage of the water swellable material in the sealant ranges from 20% to 30%. Considering that the water swellable material mainly swells in water, a mass percentage of the water swellable material in the sealant should not be too high. The embodiment of the present disclosure is illustrated with that the sealant is mainly used for cell-assembling of the array substrate motherboard and the color filter substrate motherboard, and the value of the mass percentage of the water swellable material in the sealant ranges from 20% to 30% as an example.

Exemplarily, the sealant can includes, in mass percentage, 40%-50% of light-cured resin, 1%-5% of epoxy resin, 0.5%-1% of photoinitiator, 5%-10% of curing agent, 1%-2% of coupling agent, 1%-5% of Si ball processed by safety gas, and 20%-30% of the water swellable material. For example, the light-cured resin can be low-viscosity epoxy acrylate light-cured resin with relative molecular mass being 5000-100000, and for example, can be bisphenol A type epoxy acrylate, phenolic epoxy acrylate and the like. The photoinitiator can be a peroxide such as benzoperoxide, lauroyl peroxide, azodiisobutyronitrile. The curing agent can be a common curing agent such as fatty amine, aromatic amine.

An embodiment of the present disclosure provides a preparation method of a sealant, including:

mixing and stirring a water swellable material and a material forming a body adhesive material in proportion in a dry environment, so that the water swellable material can be dispersed and doped in the material forming body adhesive material.

Exemplarily, a composition material of the body adhesive material includes light-cured resin, a photoinitiator, a curing agent, a coupling agent and the like. According to the mass percentage of the sealant provided by the embodiment of the present disclosure, the light-cured resin, the photoinitiator, the curing agent, the coupling agent and the water swellable material are mixed and stirred.

It should be noted that in a case that the body adhesive material further includes a silicon ball, the silicon ball is added and stirred after the light-cured resin, the photoinitiator, the curing agent, the coupling agent and the water swellable material are mixed and stirred.

For example, the dry environment can be an environment with relative humidity being 10% or less. In order to guarantee quality of the sealant, mixing and stirring are performed, for example, in an environment with cleanliness of level 10000 (for example, a maximum allowed number of dust particles greater than or equal to 0.5 micron per cubic meter is 350000, a maximum allowed number of dust particles greater than or equal to 5 micron per cubic meter is 2000, a maximum allowed number of airborne bacterium microorganisms per cubic meter is 100, and a maximum number of settling microbes per dish is 3). Viscosity of the formed sealant is generally 240 Pa·s-360 Pa·s. For example, the viscosity of the formed sealant is 300 Pa·s.

For example, after the water swellable material and the material forming the body adhesive material are mixed and stirred in proportion, defoaming treatment is performed on the body adhesive material where the water swellable material is dispersed and doped.

For example, the body adhesive material where the water swellable material is dispersed and doped can be placed in a vacuum kettle, air pressure is controlled at $10^{-6}$ Pa or less, and stirring is performed for 30 minutes, so that bubbles in the sealant can be further reduced.

Figure 2:
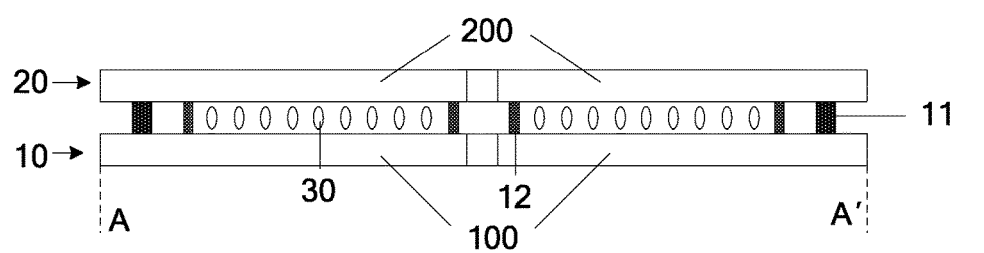
FIG. 2 is a schematic diagram of a cross section of the display panel motherboard shown in FIG. 1 along an A-A' line.
Figure 3:
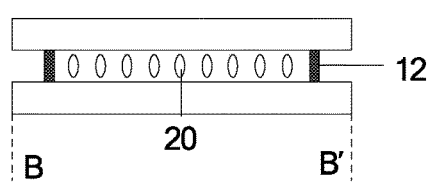
FIG. 3 is a schematic diagram of a cross section of the display panel motherboard shown in FIG. 1 along a B-B' line.

An embodiment of the present disclosure provides a display panel motherboard, as shown in FIG. 1 to FIG. 3, including: a first motherboard 10 and a second motherboard 20 which are cell-assembled with each other. As shown in FIG. 1 and FIG. 2, the first motherboard 10 includes a plurality of first substrate units 100, the second motherboard 20 includes a plurality of second substrate units 200, and the first substrate units 100 correspond to the second substrate units 200 in one-to-one correspondence.

The first motherboard 10 and the second motherboard 20 is provided with first sealant 11 in a first packaging region R1, and the first packaging region R1 is a region surrounding the plurality of first substrate units and the plurality of second substrate units, wherein, the first sealant 11 is the sealant provided by the embodiment of the present disclosure.

The first substrate unit 10 and the second substrate unit 20 are provided with second sealant 12 in a second packaging region R2.

As shown in FIG. 1 to FIG. 3, taking that the display panel is a liquid crystal display panel as an example, the liquid crystal layers 30 are filled between the first motherboard 10 and the second motherboard 20, wherein the second packaging region is a region surrounding the liquid crystal layer 30.

Of course, the display panel can also be an OLED display panel or an electronic paper display panel or the like. The embodiment of the present disclosure and the drawings are only illustrated in detail by taking that the display panel is the liquid crystal display panel as an example.

The first sealant 11 is the sealant provided by the embodiment of the present disclosure, and thus a water swellable material is dispersed and doped in the first sealant. The second sealant is used for surrounding the liquid crystal layer and thus mainly needs to have a good water vapor isolation effect and good adhesiveness, and therefore the second sealant may not be the sealant provided by the embodiment of the present disclosure.

A function of the first sealant in manufacturing of the display panel motherboard is illustrated in detail in combination with a manufacturing method of the display panel motherboard.

Figure 4:
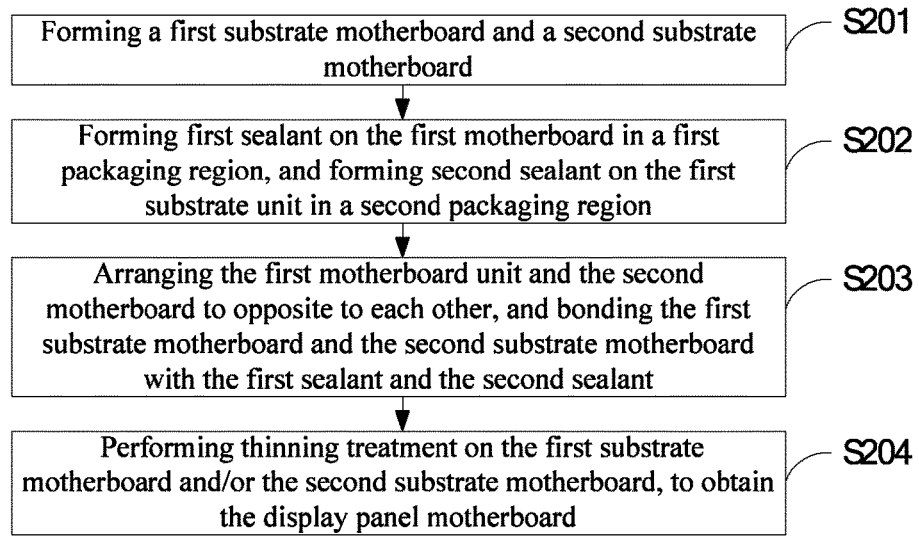
FIG. 4 is a flow diagram of a manufacturing method of the display panel motherboard provided by the embodiment of the present disclosure.

An embodiment of the present disclosure provided a manufacturing method of a display panel motherboard, as shown in FIG. 4, including:

S201: forming a first motherboard and a second motherboard, wherein the first motherboard includes a plurality of first substrate units, and the second motherboard includes a plurality of second substrate units.

For example, taking that the display panel is a liquid crystal display panel as an example, the first motherboard can be a motherboard of array substrate, the second motherboard can be a motherboard of color filter substrate. Then, the first substrate unit can be an array substrate, and the second substrate unit can be a color filter substrate. One array substrate and one color filter substrate are cell-assembled to form the display panel unit, such as a mobile phone display panel.

S202: forming first sealant on the first motherboard in a first packaging region, and forming second sealant on the first substrate unit in a second packaging region.

The first packaging region is a region surrounding the plurality of first substrate units, and the first sealant is the sealant provided by the embodiment of the present disclosure. As shown in FIG. 1, the first sealant 11 surrounds a plurality of display panel units P.

S203: arranging the first motherboard unit and the second motherboard opposite to each other, and bonding the first motherboard and the second motherboard by the first sealant and the second sealant.

As shown in FIG. 2, the first substrate units 100 in the first motherboard 10 correspond to the second substrate units 200 in the second motherboard 20 in one-to-one correspondence.

S204: performing thinning treatment on the first motherboard and/or the second motherboard, to obtain the display panel motherboard. The display panel motherboard includes a plurality of display panel units. As shown in FIG. 3, one display panel unit includes the first substrate unit and the second substrate unit cell-assembled with each other by the second sealant 12.

For example, the thinning treatment performed on the first motherboard and/or the second motherboard, generally is etching a glass substrate of the first motherboard and/or the second motherboard by acidic etching solution, so as to reduce a thickness of the glass substrate, and therefore the display panel can be lighter and thinner.

In the manufacturing method of the display panel motherboard provided by the embodiment of the present disclosure, the first motherboard and the second motherboard are packaged by the first sealant, wherein the water swellable material is dispersed and doped in the body adhesive material in the first sealant. In this way, when the thinning treatment is performed on the first motherboard and/or the second motherboard, if the first sealant has a notch, the acidic etching solution makes contact with the first sealant at a position of the notch, the water swellable material in the first sealant adsorbs water and then swells, and the notch is made to be automatically closed, which thus prevents the acidic etching solution from etching the display panel, and improves a yield of a product.

For example, before the thinning treatments is performed on the first motherboard and/or the second motherboard, the manufacturing method of the display panel motherboard further includes: performing curing treatment on the first sealant.

Figure 5:
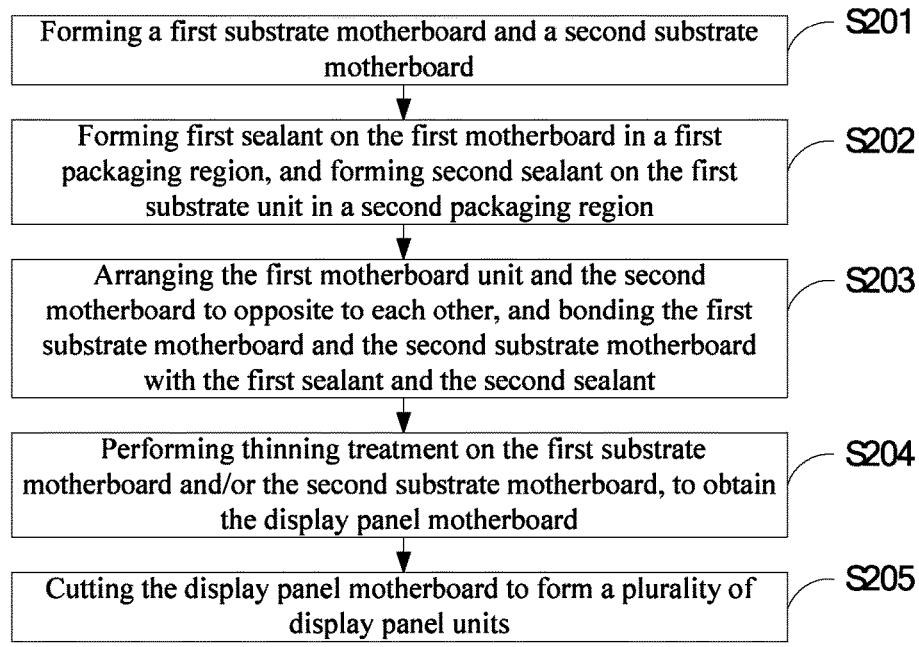
FIG. 5 is a flow diagram of a manufacturing method of a display panel unit provided by an embodiment of the present disclosure.

As shown in FIG. 5, after the above step S204, the manufacturing method of the display panel motherboard provided by the embodiment of the present disclosure, further includes:

S205: cutting the display panel motherboard to form a plurality of display panel units. The display panel motherboard is cut along a dashed line as shown in FIG. 2, and the obtained display panel units are as shown in FIG. 3.

Although the embodiment of the disclosure has been described above in great detail with general descriptions and specific embodiments, on the basis of the embodiment of the disclosure, various changes and improvements may be made, which is apparent to those skilled in the art. Therefore, all such changes and improvements without departing from the spirit of the disclosure are within the scope of the claims of the disclosure.

What is claimed is:

1. A display panel motherboard, comprising: a first motherboard and a second motherboard which are cell-assembled with each other, wherein, the first motherboard includes a plurality of first substrate units, the second motherboard includes a plurality of second substrate units, and the first substrate units correspond to the second substrate units in one-to-one correspondence;
  a first sealant is provided on the first motherboard and the second motherboard in a first packaging region of, and the first packaging region is a region surrounding the plurality of first substrate units and the plurality of second substrate units;
  a second sealant is provided on the first substrate unit and the second substrate unit in a second packaging region;
  wherein, the first sealant is a sealant comprising a main adhesive material and a water swellable material dispersed and doped in the main adhesive material,
  wherein, a value of a water swelling rate of the water swellable material ranges from 110% to 200%.

2. The display panel motherboard according to claim 1, wherein, a liquid crystal layer is filled between each pair of corresponding first substrate unit and second substrate unit, and the second packaging region is a plurality of regions respectively surrounding a plurality of the liquid crystal layers.

3. The display panel motherboard according to claim 2, wherein, a value of a mass percentage of the water swellable material in the sealant ranges from 20% to 30%.

4. The display panel motherboard according to claim 2, wherein, the water swellable material includes at least one of sodium polyacrylate, polyvinyl alcohol, hydrophilic polyurethane or hydrophilic rubber.

5. The display panel motherboard according to claim 1, wherein, a value of a mass percentage of the water swellable material in the sealant ranges from 20% to 30%.

6. The display panel motherboard according to claim 1, wherein, the water swellable material includes at least one of sodium polyacrylate, polyvinyl alcohol, hydrophilic polyurethane or hydrophilic rubber.

7. The display panel motherboard according to claim 1, wherein, the body adhesive material includes: light-cured resin, a photoinitiator, a curing agent, a coupling agent and a silicone ball.

8. A manufacturing method of a display panel motherboard, comprising:
  forming a first motherboard and a second motherboard, wherein the first motherboard includes a plurality of first substrate units, and the second motherboard includes a plurality of second substrate units;
  forming a first sealant in a first packaging region of the first motherboard, and forming a second sealant in a second packaging region of the first substrate unit, wherein, the first packaging region is a region surrounding a plurality of the first substrate units, and the first sealant is a sealant comprising a main adhesive material and a water swellable material dispersed and doped in the main adhesive material;
  arranging the first motherboard unit and the second motherboard opposite to each other, and bonding the first motherboard and the second motherboard by the first sealant and the second sealant, wherein the plurality of first substrate units in the first motherboard correspond to the plurality of second substrate units in the second motherboard in one-to-one correspondence;
  performing a thinning treatment on the first motherboard and/or the second motherboard, to obtain the display panel motherboard,
  wherein a preparation method of the first sealant, comprising:
  mixing and stirring a water swellable material and a material forming a body adhesive material in proportion, so that the water swellable material can be dispersed and doped in a body adhesive material,
  wherein, mixing and stirring the water swellable material and the material forming the body adhesive material in proportion is performed in a dry environment with relative humidity lower than 10%.

9. The manufacturing method of the display panel motherboard according to claim 8, further comprising: before the performing thinning treatment on the first motherboard and/or the second motherboard, performing curing treatment on the first sealant.

10. The manufacturing method of the display panel motherboard according to claim 8, wherein, a value of a water swelling rate of the water swellable material ranges from 110% to 200%.

11. The manufacturing method of the display panel motherboard according to claim 8, wherein, a value of a mass percentage of the water swellable material in the sealant ranges from 20% to 30%.

12. The manufacturing method of the display panel motherboard according to claim 8, wherein, the water swellable material includes at least one of sodium polyacrylate, polyvinyl alcohol, hydrophilic polyurethane or hydrophilic rubber.

13. The manufacturing method of the display panel motherboard according to claim 8, wherein, the body adhesive material includes: light-cured resin, a photoinitiator, a curing agent, a coupling agent and a silicone ball.

14. A manufacturing method of a display panel motherboard, comprising:

forming a first motherboard and a second motherboard, wherein the first motherboard includes a plurality of first substrate units, and the second motherboard includes a plurality of second substrate unit;

forming a first sealant in a first packaging region of the first motherboard, and forming a second sealant in a second packaging region of the first substrate unit, wherein, the first packaging region is a region surrounding a plurality of the first substrate units, and the first sealant is a sealant comprising a main adhesive material and a water swellable material dispersed and doped in the main adhesive material;

arranging the first motherboard unit and the second motherboard opposite to each other, and bonding the first motherboard and the second motherboard by the first sealant and the second sealant, wherein the plurality of first substrate units in the first motherboard correspond to the plurality of second substrate units in the second motherboard in one-to-one correspondence;

performing a thinning treatment on the first motherboard and/or the second motherboard, to obtain the display panel motherboard, wherein a preparation method of the first sealant, comprising:

mixing and stirring a water swellable material and a material forming a body adhesive material in proportion, so that the water swellable material can be dispersed and doped in a body adhesive material, wherein, after mixing and stirring the water swellable material and the material forming the body adhesive material in proportion, the method further comprises:

performing defoaming treatment on the body adhesive material in which the water swellable material is dispersed and doped.

\* \* \* \* \*